(12) United States Patent
Seong

(10) Patent No.: US 8,946,745 B2
(45) Date of Patent: Feb. 3, 2015

(54) SUPPORTING SUBSTRATE FOR MANUFACTURING VERTICALLY-STRUCTURED SEMICONDUCTOR LIGHT-EMITTING DEVICE AND SEMICONDUCTOR LIGHT-EMITTING DEVICE USING THE SUPPORTING SUBSTRATE

(75) Inventor: Tae Yeon Seong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 875 days.

(21) Appl. No.: 13/054,472

(22) PCT Filed: Jul. 15, 2009

(86) PCT No.: PCT/KR2009/003905
§ 371 (c)(1),
(2), (4) Date: Jan. 14, 2011

(87) PCT Pub. No.: WO2010/008209
PCT Pub. Date: Jan. 21, 2010

(65) Prior Publication Data
US 2011/0114984 A1    May 19, 2011

(30) Foreign Application Priority Data
Jul. 15, 2008  (KR) .................. 10-2008-0068536

(51) Int. Cl.
*H01L 33/10* (2010.01)
*H01L 33/00* (2010.01)
(Continued)

(52) U.S. Cl.
CPC ...... *H01L 33/0079* (2013.01); *H01L 21/76254* (2013.01); *H01L 33/62* (2013.01);
(Continued)

(58) Field of Classification Search
None
See application file for complete search history.

(56) References Cited

U.S. PATENT DOCUMENTS

2003/0111667 A1*  6/2003  Schubert .................. 257/98
2003/0160257 A1   8/2003  Bader et al. .............. 257/98
(Continued)

FOREIGN PATENT DOCUMENTS

EP    1 821 348 A2    8/2007
EP    2 302 705 A2    3/2011
(Continued)

OTHER PUBLICATIONS

Korean Office Action dated Jul. 31, 2012 issued in Application No. 10-2008-0068536.
(Continued)

*Primary Examiner* — Matthew W Such
*Assistant Examiner* — Abul Kalam
(74) *Attorney, Agent, or Firm* — KED & Associates LLP

(57) ABSTRACT

The present invention is related to a supporting substrate for manufacturing vertically-structured semiconductor light emitting device and a vertically-structured semiconductor light emitting device using the same, which minimize damage and breaking of a multi-layered light-emitting structure thin film separated from a sapphire substrate during the manufacturing process, thereby improving the whole performance of the semiconductor light emitting device.

The supporting substrate for manufacturing the vertically-structured semiconductor light emitting device of the present invention comprises: a selected supporting substrate formed of a material having a difference of thermal expansion coefficient of 5 ppm or less from a sapphire substrate on which a multi-layered light-emitting structure thin film comprising a Group III-V nitride-based semiconductor is laminated; a sacrificial layer formed on the selected supporting substrate; a thick metal film formed on an upper part of the sacrificial layer; and a bonding layer formed on an upper part of the thick metal layer and formed of a soldering or brazing alloy material.

23 Claims, 19 Drawing Sheets

(51) Int. Cl.
  *H01L 21/762* (2006.01)
  *H01L 33/62* (2010.01)
  *H01L 33/40* (2010.01)

(52) U.S. Cl.
  CPC .............. *H01L 33/007* (2013.01); *H01L 33/40* (2013.01); *H01L 2924/0002* (2013.01)
  USPC .................. 257/98; 257/618; 438/29; 438/33

(56) References Cited

U.S. PATENT DOCUMENTS

| | | | |
|---|---|---|---|
| 2004/0191939 A1* | 9/2004 | Kon et al. | 438/22 |
| 2004/0238837 A1 | 12/2004 | Jacob et al. | 257/99 |
| 2005/0205875 A1 | 9/2005 | Shei et al. | 257/79 |
| 2006/0138532 A1 | 6/2006 | Okamoto et al. | 257/328 |
| 2006/0189098 A1 | 8/2006 | Edmond | 438/460 |
| 2007/0295952 A1 | 12/2007 | Jang et al. | 257/15 |
| 2008/0073665 A1 | 3/2008 | Slater et al. | 257/103 |
| 2009/0014738 A1* | 1/2009 | Shiue et al. | 257/98 |

FOREIGN PATENT DOCUMENTS

| | | |
|---|---|---|
| JP | 2002-111051 A | 4/2002 |
| JP | 2003-273399 A | 9/2003 |
| JP | 2004-281863 A | 10/2004 |
| JP | 2005-236304 A | 9/2005 |
| JP | 2006-516066 A | 6/2006 |
| JP | 2006-332681 A | 12/2006 |
| JP | 2007-081089 A | 3/2007 |
| JP | 2007-536725 A | 12/2007 |
| JP | 2008-21965 A | 1/2008 |
| JP | 2008-538658 A | 10/2008 |
| JP | 2011-517085 A | 5/2011 |
| KR | 10-2005-34970 A | 4/2005 |
| KR | 10-2007-0006966 A | 1/2007 |
| KR | 10-2008-0040359 A | 5/2008 |
| KR | 10-2008-0053180 A | 6/2008 |
| KR | 10-2011-0056775 A | 5/2011 |
| WO | WO 2003-065464 A1 | 8/2003 |
| WO | WO 2007-049939 A1 | 5/2007 |

OTHER PUBLICATIONS

Chinese Office Action dated Aug. 6, 2012 issued in Application No. 200980128829.7.

Japanese Office Action dated Dec. 4, 2012 issued in Application No. 2011-518649.

International Search Report mailed Feb. 24, 2010, issued in corresponding International Application No. PCT/KR2009/003905, filed Jul. 15, 2009, 2 pages.

European Search Report dated Feb. 6, 2014 issued in Application No. 09 79 8112.

European Search Report dated Feb. 6, 2014 issued in Application No. 11 00 2049.

European Search Report dated Feb. 6, 2014 issued in Application No. 11 00 2050.

Japanese Office Action dated Jun. 24, 2014 issued in foreign application No. 2013-128536

Korean Office Action dated Aug. 20, 2012 issued in Application No. 10-2011-0095961.

\* cited by examiner

FIG. 2   PRIOR ART
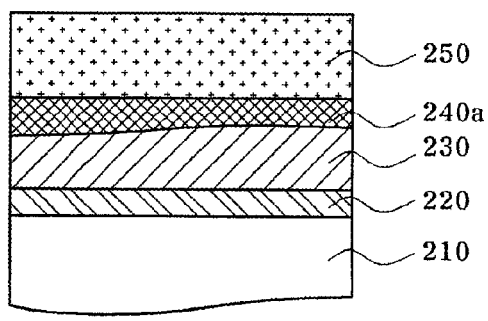
(a)
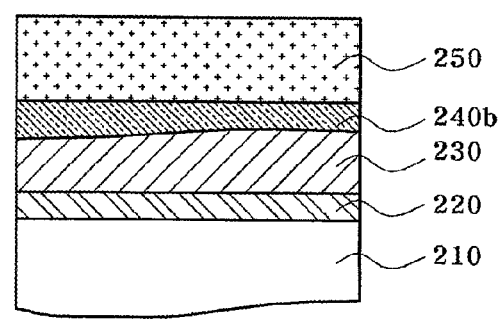
(b)

(a)     (b)

SUPPORTING SUBSTRATE FOR MANUFACTURING VERTICALLY-STRUCTURED SEMICONDUCTOR LIGHT-EMITTING DEVICE AND SEMICONDUCTOR LIGHT-EMITTING DEVICE USING THE SUPPORTING SUBSTRATE

TECHNICAL FIELD

The present invention relates to a supporting substrate for manufacturing a vertically-structured semiconductor light emitting device and a vertically-structured semiconductor light emitting device using the same. More particularly, it relates to: 1) a supporting substrate for manufacturing a vertically-structured semiconductor light emitting device by using a multi-layered light-emitting structure thin film including a Group III-V nitride-based semiconductor; 2) a method for manufacturing a vertically-structured semiconductor light emitting device which is able to improve the whole performance of the semiconductor light emitting device by reducing damage of the multi-layered light-emitting structure thin film separated from a sapphire substrate during the manufacturing process such as laser lift off, wafer bonding, etc. by using a high performance heat sink support including thick metal film and metal foil; and 3) a vertically-structured semiconductor light emitting device having a heat-sink support.

BACKGROUND

Generally, a semiconductor light-emitting device has a light-emitting diode (LED) and a laser diode (LD) generating light when a forward current flows. Particularly, the LED and LD have a common p-n junction, and when a current is applied to the light-emitting device, the current is converted to photons, and light is emitted from the device.

The light emitted from the LED and LD has various wavelengths from a long wavelength to a short wavelength depending on the semiconductor material(s). Above all, LEDs made from wide band-gap semiconductors allow red, green and blue colors in visible bands and have been applied widely in industries such as displays for electronic devices, traffic lights, and various light sources for display devices. Due to the development of white light in recent years, it will be widely used as the next generation light source for general lighting.

A Group III-V nitride-based semiconductor is generally produced hetro-epitaxially on the upper part of sapphire to obtain high quality semiconductor thin films, and sapphire, silicon carbide (SiC), silicon (Si) and the like have been used as an initial substrate.

Among them, the sapphire substrate has a significantly different lattice constant and thermal expansion coefficient compared to those of the Group III-V nitride-based semiconductor, and thus it has been difficult to laminate a multi-layered light-emitting structure thin film including the Group III-V nitride-based semiconductor. Further, since the sapphire substrate has poor thermal conductivity, a large current cannot be applied to LEDs. Since the sapphire substrate itself is an electrical insulator and thereby is difficult to respond to static electricity flowed in from outside, it has a high possibility to cause failure due to the static electricity. Such drawbacks not only reduce reliability of devices but also cause a lot of constraints in packaging processes.

Further, the sapphire substrate, which is an insulator, has a MESA structure, in which both an n-type ohmic contact electrode and a p-type ohmic contact electrode are formed in the same growth direction as that of a multi-layered light-emitting structure including the Group III-V nitride-based semiconductor. Since an LED chip area should be higher than a certain size, there is a limit to reducing the LED chip area, restricting the improvement of LED chip production.

In addition to these disadvantages of the MESA-structured LEDs grown on the upper part of the sapphire initial substrate as an initial substrate, it is difficult to release a great amount of heat outward generated inevitably during the operation of the light-emitting device since the sapphire substrate has poor thermal conductivity.

Due to these reasons, there is a limitation in applying the MESA structure, to which the sapphire substrate is attached, to light-emitting devices used for a large area and a large capacity (that is, a large current) such as the light for large displays and general lighting. When a high current is applied to a light-emitting device for a long period of time, the internal temperature of a light-emitting active layer is gradually increased, largely due to the generated heat, and thereby an LED light-emitting efficiency is gradually decreased.

A silicon carbide (SiC) substrate, unlike the sapphire substrate, not only has good thermal and electric conductivities but also allows a multi-layered light-emitting structure thin film to be laminated and grown since it has a similar lattice constant and thermal expansion coefficient (TEC), which are important factors in the semiconductor single crystal thin film growth, as that of the Group III-V nitride-based semiconductor. Further, it allows the manufacturing of various types of vertically-structuredvertically-structuredvertically-structuredvertically-structured light-emitting devices.

However, because producing a high quality SiC substrate is not easy, it is more expensive than producing other single crystal substrates, making it difficult for mass production.

Therefore, it is most desirable to provide a high-performance light-emitting device by using a multi-layered light-emitting structure including the Group III-V nitride-based semiconductor laminated and grown on a sapphire substrate in view of the technology, economy and performance.

As described above, much effort has been made to produce a high-performance vertically-structured LED by growing a high quality multi-layered light-emitting structure thin film including the Group III-V nitride-based semiconductor on the upper part of sapphire, SiC or Si, etc. of the initial substrate, lifting off the multi-layered light-emitting structure thin film including the Group III-V nitride-based semiconductor from the initial substrate and using the result, in order to resolve the problems associated with the MESA-structured LEDs produced by using a thin film which is a multi-layered light-emitting structure including A Group III-V nitride-based semiconductor laminated/grown on the upper part of a sapphire substrate which is an initial substrate.

FIG. 1 is a sectional view illustrating a process for separating a sapphire substrate by employing a conventional laser lift off (LLO) process.

As shown in FIG. 1, when a laser beam, which is a strong energy source, is irradiated to the backside of a transparent sapphire substrate 110, the laser beam is absorbed strongly at an interface 120, and the temperature of 900° C. or higher is thereby generated momentarily and causes thermochemical dissociation of gallium nitride (GaN), InCaN at the interface, and further separates the sapphire substrate 110 from a nitride-based semiconductor thin film 130.

However, it has been reported in many documents that in the laser lift-off process of the multi-layered light-emitting structure thin film including the Group III-V nitride-based semiconductor, the semiconductor single crystal thin film is damaged and broken after being separated from the sapphire substrate due to a mechanical stress generated between the thick sapphire substrate and the Group III-V nitride-based semiconductor thin film because of the difference in the lattice constant and thermal expansion coefficient.

When the multi-layered light-emitting structure thin film is damaged and broken, it causes a large leaky current, reduces the chip yield of light-emitting devices and reduces the overall performance of the light-emitting devices. Therefore, studies are currently under way for manufacturing a high-performance vertically-structured LED by using the lift-off process of the sapphire substrate that can minimize damage to the multi-layered light-emitting structure thin film, and the separated multi-layered light-emitting structure thin film.

As a result, various methods have been suggested to minimize the damage and breaking of the multi-layered light-emitting structure thin film including the Group III-V nitride-based semiconductor when the sapphire substrate is separated by the LLO process.

FIG. 2 is sectional views illustrating a process for forming a conductive support closely attached in the growth direction by employing a wafer bonding and electro plating process prior to the laser lift off process according to a conventional technology to prevent damage and breaking of a semiconductor multi-layered light-emitting structure thin film.

Referring to (a) in FIG. 2, a conductive support 250, which is strongly attached and is structurally stable, is formed by using wafer bonding on the upper part of a bonding layer 240a before lifting off multi-layered light-emitting structure thin films 220, 230 including a Group III-V nitride-based semiconductor from a sapphire substrate 210 by irradiating the backside of the transparent sapphire substrate with a laser beam. Referring to (b) in FIG. 2, a conductive support 250, which is strongly attached and is structurally stable, is formed on the upper part of a seed layer 240b by using an electro plating process before lifting off multi-layered light-emitting structure thin films 220, 230 from a sapphire substrate 210.

FIG. 3 is a sectional view illustrating vertically-structured Group III-V nitride-based semiconductor light-emitting devices manufactured by introducing the conductive support, which is strongly attached and is structurally stable, according to the conventional technology used in the process of FIG. 2.

The figure indicated by (a) in FIG. 3 is a sectional view illustrating a semiconductor light-emitting device manufactured by using the method for manufacturing the conductive support indicated by (a) in FIG. 2. Referring to (a) in FIG. 3 illustrating a vertically-structured LED section bonded with a wafer bonding, it is successively constituted with a support 310, which is a thermal and electrical conductor, a bonding layer 320a, a multi-layered metal layer including a p-type ohmic contact electrode 330, a p-type semiconductor cladding layer 340, a light-emitting active layer 350, an n-type semiconductor cladding layer 360, and an n-type ohmic contact electrode 370. A semiconductor wafer such as silicon (Si), germanium (Ge), silicon-germanium (SiGe), gallium arsenide (GaAs) and the like having an excellent thermal and electrical conductivity is preferably used as the support 310.

However, the support 310, used for the vertically-structured light-emitting device (LED) as shown in (a) of FIG. 3, causes significant wafer warpage and fine micro-cracks inside the multi-layered light-emitting structure thin film when Si or another conductive support is bonded by wafer bonding because it has a significant difference in thermal expansion coefficient (TEC) against the sapphire substrate on which the multi-layered light-emitting structure thin films 340-360 are grown/laminated. Such problems further cause processing difficulties and lower the performance of an LED manufactured therefrom and the product yield.

The figure indicated by (b) in FIG. 3 is a sectional view illustrating a semiconductor light-emitting device manufactured by using the method for manufacturing the conductive support indicated by (b) in FIG. 2. Referring to (b) in FIG. 3 illustrating the sectional view of the vertically-structured LED formed through electro plating, the vertically-structured light-emitting device (LED) formed through an LLO and electro plating process has the same structure of (a) in FIG. 3, except having a seed layer 320b, instead of the bonding layer 320a. The electrically conductive support 310, which is a thick metal film formed through electro plating, is preferably formed with a single metal such as Cu, Ni, W, Au, Mo and the like or an alloy composed thereof.

The LED support 310 having the structure described above as shown in (b) of FIG. 3 has a significantly higher thermal expansion coefficient and flexibility than the sapphire substrate due to the metal or alloy thick film formed through electro plating, thereby causing curling, wafer warpage, breaking, etc. during a "chip manufacturing process" such as mechanical sawing or laser scribing, etc.

Therefore, it is highly demanded to develop highly efficient heat sink supports suitable for manufacturing the high performance vertically-structured light-emitting devices so as to resolve the problems of wafer warpage, breaking, micro-crack, limitations in post-processing including annealing and chip processing, low product yield, etc. while manufacturing the vertically-structured Group III-V nitride-based semiconductor light-emitting device using the LLO process.

DISCLOSURE

The first aspect of the present invention is to provide a supporting substrate for manufacturing a vertically-structured semiconductor light emitting device that minimizes wafer warpage or breakings, during wafer bonding or laser lift off process, inside the multi-layered light-emitting structure thin film including a Group III-V nitride-based semiconductor.

The second aspect of the present invention is to provide a high quality vertically-structured semiconductor light emitting device that does not cause fine micro-cracks, using a high performance heat-sink support including a metal foil and a thick metal film included in the supporting substrate, etc.

The third aspect of the present invention is to provide a method for manufacturing a vertically-structured semiconductor light emitting device including a high performance heat-sink support, by using the supporting substrate for manufacturing a semiconductor light emitting device.

In order to obtain the first aspect, the supporting substrate for manufacturing a vertically-structured semiconductor light emitting device according to the invention includes: a selected supporting substrate formed of a material having a difference of thermal expansion coefficient of 5 ppm or less from a sapphire substrate on which a multi-layered light-emitting structure thin film including a Group III-V nitride-based semiconductor is laminated; a sacrificial layer formed on the selected supporting substrate; a thick metal film formed on the upper part of the sacrificial layer; and a bonding layer formed on the upper part of the thick metal layer and formed of soldering or brazing alloy material.

In order to obtain the second aspect, a vertically-structured semiconductor light emitting device according to an embodiment of the invention includes: a light emitting structure including Group III-V nitride-based semiconductors and formed with a first ohmic contact electrode on the upper part, successively formed with a second ohmic contact electrode, an insulating thin film, a first conductive thin film, a second conductive thin film and a first thick metal film on the bottom, and formed with a passivation thin film on the side thereof; a metal foil bonded on the bottom part of the first thick metal film by a first bonding layer; and a second thick metal film bonded at the bottom part of the metal foil by a second bonding layer.

In order to obtain the third aspect, a method for manufacturing a vertically-structured semiconductor light emitting device according to an embodiment of the invention includes: (a) preparing a first wafer successively formed with a multi-layered light-emitting structure thin film comprising a Group III-V nitride-based semiconductor, a plurality of second ohmic contact electrodes, a first thick metal film and a first-first bonding layer on the upper part of a sapphire substrate; (b) preparing a metal foil formed with a first-second bonding layer on the upper surface and a second-first bonding layer on the bottom surface thereof; (c) preparing a second wafer successively formed with a sacrificial layer, a second thick metal film and a second-second bonding layer on the upper surface of the selected supporting substrate; (d) bonding the first wafer, the metal foil and the second wafer to bond the first-first bonding layer and the first-second bonding layer and bond the second-first bonding layer and the second-second bonding layer; (e) separating the sapphire substrate of the first wafer from the result of the step (d) by a laser lift off process; (f) isolating the multi-layered light-emitting structure thin film exposed by the step (e); (g) forming a plurality of first ohmic contact electrodes on the surface and passivation thin film on the side of each multi-layered light-emitting structure isolated by the step (f); (h) separating the selected supporting substrate of the second wafer; and (i) manufacturing chips by vertically cutting the result of the step (h).

BRIEF DESCRIPTION OF THE DRAWINGS

FIG. 2 is sectional views illustrating supporting substrates formed in the growth direction of the vertically-structured semiconductor light emitting device before performing the laser lift off process according to a conventional technology.

MODE FOR INVENTION

Figure 1:
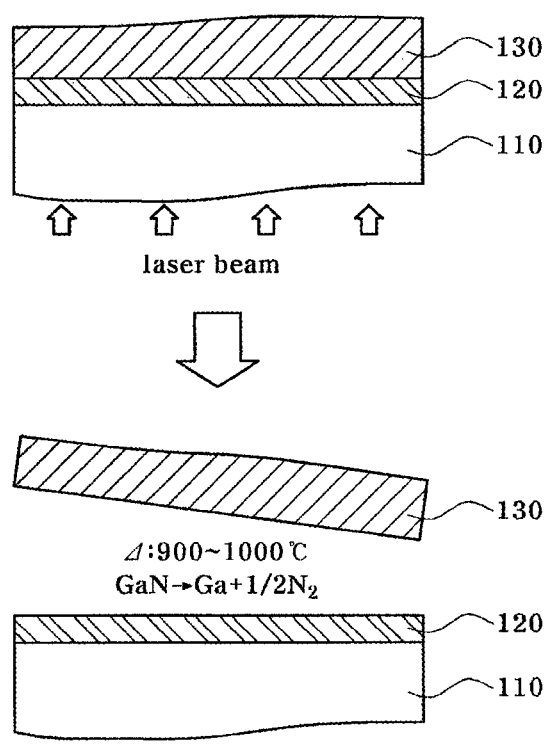
FIG. 1 is a sectional view illustrating a general laser lift-off (LLO) process in manufacturing a vertically-structured semiconductor light-emitting device according to a conventional technology.
Figure 3:
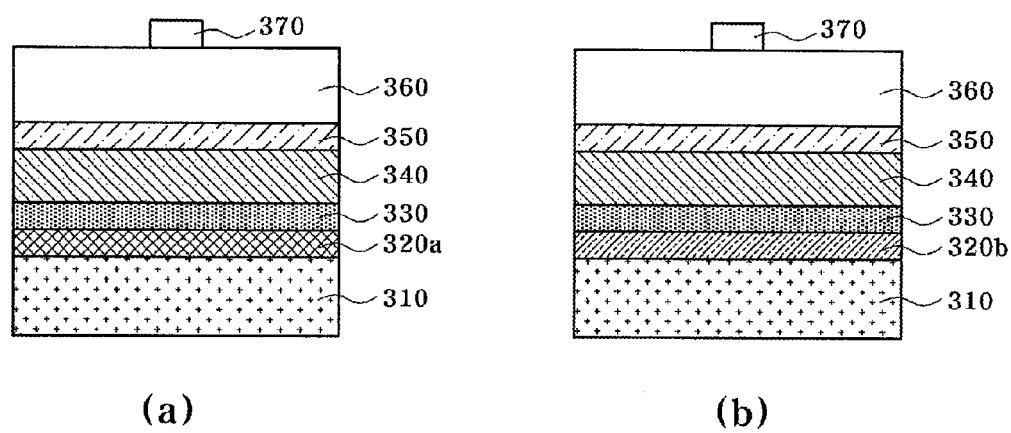
FIG. 3 is sectional views illustrating Group III-V nitride-based semiconductor light-emitting devices manufactured by bonding a supporting substrate and using the LLO process according to a conventional technology.

Hereinafter, a supporting substrate for preparing a semiconductor light-emitting device, a method for preparing a vertically-structured semiconductor light emitting device using the same, and a vertically-structured semiconductor light emitting device will be described in detail with reference to the accompanying drawings.

Supporting Substrate for Preparing a Vertically-structured Light Emitting Device FIG. 4(a) is a sectional view illustrating an embodiment of a supporting substrate for manufacturing a vertically-structured semiconductor light emitting device according to the invention.

Referring to FIG. 4(a), a supporting substrate for manufacturing a light emitting device 400 according to the present invention includes a selected supporting substrate 410, a sacrificial layer 420, a thick metal film 430 and a bonding layer 440.

When a multi-layered light-emitting structure thin film is separated by a laser lift off or another process from a transparent sapphire substrate, an initial substrate, on which the multi-layered light-emitting structure thin film including a Group III-V nitride-based semiconductor is laminated, the selected supporting substrate 410 absorbs a mechanical impact (or shock) and functions as a support for minimizing the damage of the separated multi-layered light-emitting structure thin film having a thickness of several micrometers (μm).

The selected supporting substrate 410 is formed of a material having a difference of thermal expansion coefficient of 5 ppm or less from a sapphire substrate. This is to minimize wafer warpage which can be often caused due to the difference in thermal expansion coefficients between the supporting substrate 400 and the sapphire substrate after a wafer bonding, which is performed to bond the supporting substrate 400 and the sapphire substrate before separating the multi-layered light-emitting structure thin film from the sapphire substrate. Thus, the selected supporting substrate 410 can be composed of a single crystal, polycrystal, or amorphous substrate wafer such as sapphire, SiC, Ge, GaAs, SiGe, Si, AlN, MgO, AlSiC, BN, BeO, $TiO_2$, $SiO_2$, Si—Al, GaN, ZnO, Glass and the like, which have same or difference of 5 ppm or less of the thermal expansion coefficient, compared to that of a sapphire substrate.

The sacrificial layer 420 can be a material layer necessary for separating and removing the selected supporting substrate 410 from the finally completed vertically-structured light emitting device and can be a single crystal, polycrystal or amorphous compound bonded with nitrogen or oxygen. A material that can be used for the sacrificial layer 420 can be GaN, InGaN, ZnO, GaZnO, MgZnO, InZnO, InN, $In_2O_3$, $GaInO_3$, $MgInO_4$, $CuInO_2$, ZnInO, ITO, $SnO_2$, $Si_3N_4$, $SiO_2$, BeMgO, TiN, VN, CrN, TaN, or the like when the selected supporting substrate 410 is removed by the laser lift off process.

Further, a material that can be used for the sacrificial layer 420 can be metal, alloy, solid solution, oxides, nitrides or thermophile organic materials when the selected supporting substrate 410 is removed by a chemical etching process.

Further, the sacrificial layer 420 can be at least one selected from the group consisting of heat-resistant adhesives, heat-resistant adhesive tapes, silicone adhesives and polyvinyl butyral resins when it is composed of a heat-resistant adhesive material.

Further, the sacrificial layer 420 can include a silicate or a silicic acid material if the sacrificial layer is an SOG (Spin on Glass) thin film, and the sacrificial layer 420 can include silicate, siloxane, methyl silsequioxane (MSQ), hydrogen silsequioxane (HSQ), MQS+HSQ, perhydrosilazane (TCPS) or polysilazane, etc. if the sacrificial layer is an SOD (Spin On Dielectrics) thin film.

Further, the sacrificial layer 420 can include at least one selected from the group consisting of AZ series, SU-8 series, TLOR series, TDMR series, and GXR series if the sacrificial layer is composed of photoresist.

A composition material for the sacrificial layer 420 can be appropriately selected according to characteristics of the selected supporting substrate 410, separation methods and vertical structures finally to be manufactured.

The thick metal film 430 attenuates stress derived from thermal and structural deformation while manufacturing a light emitting device. The thick metal film 430 can also act as an adhesion-enhancing layer to strengthen the bonding between materials and a diffusion barrier layer to prevent diffusion of materials. The thick metal film 430 can have a thickness of about 0.1-999 μm, preferably 0.1-500 μm.

The thick metal film 430 is composed of metal, alloy, or solid solution including at least one component chosen from Au, Cu, Ni, Ag, Mo, Al, Nb, W, Ti, Cr, Ta, Al, Pd, Pt and Si having high electric and thermal conductivity.

The thick metal film 430 can be formed on the sacrificial layer 420 through physical vapor deposition (PVD) or chemical vapor deposition (CVD), preferably by electro plating or electroless plating.

The bonding layer 440 is a material layer necessary for bonding a wafer including a sapphire substrate (1001 in FIG. 10), a metal foil (810 in FIG. 10), and a second wafer (1002 in FIG. 10), which is the supporting substrate 400 according to the present invention. The bonding layer 440 can be composed of a soldering or brazing alloy material including at least one component chosen from Ga, Bi, In, Sn, Pb, Au, Al, Ag, Cu, Ni, Pd, Si and Ge.

The supporting substrate for manufacturing a vertically-structured semiconductor light emitting device 400 having the above-mentioned structure according to the present invention can be manufactured by successively laminating the sacrificial layer 420, the thick metal film 430 and the bonding layer 440 on the selected supporting substrate 410.

FIG. 4(a) to FIG. 4(f) are stacked sectional views illustrating examples of various modes of supporting substrates for manufacturing a vertically-structured semiconductor light emitting device according to the present invention.

FIG. 4(a) and FIG. 4(d) are sectional views illustrating examples that are not patterned. The thick metal film illustrated in FIG. 4(d) is relatively thicker than that in FIG. 4(a).

FIGS. 4(b), 4(c), 4(e) and 4(f) are sectional views illustrating examples in which a part or all of the sacrificial layer 420, the thick metal film 430 and the bonding layer 440 are patterned. FIGS. 4(b) and 4(e) are sectional views illustrating examples in which the bonding layer 440 and the thick metal film 430 are patterned, and FIGS. 4(c) and 4(f) are sectional views illustrating examples in which patterning is formed up to the sacrificial layer 420. Further, such patterning can be formed up to a part of the selected supporting substrate 410 even though it is not shown here. As shown in FIGS. 4(b), 4(c), 4(e) and 4(f), such patterning of the bonding layer 440, the thick metal film 430, the sacrificial layer 420 and the like facilitates removing of the selected supporting substrate 410 and single chip processing during the manufacturing of a semiconductor light emitting device.

Vertically-structured Semiconductor Light Emitting Device I

Figure 5:
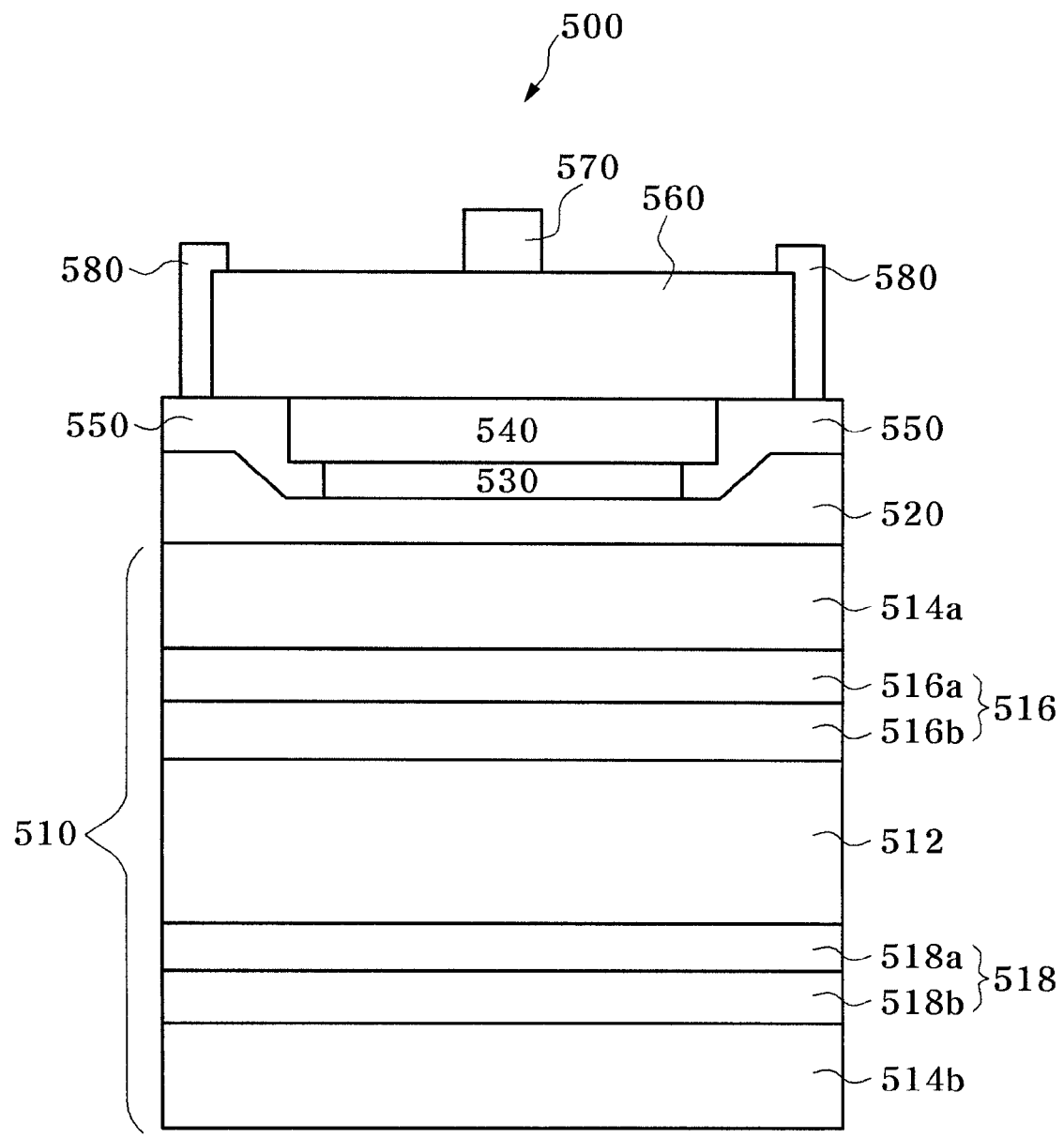
FIG. 5 is a sectional view illustrating an embodiment of a vertically-structured semiconductor light emitting device including a heat-sink support consisted with a metal foil and a couple of thick metal films.

FIG. 5 is a sectional view illustrating an example of a vertically-structured semiconductor light emitting device according to the present invention.

Referring to FIG. 5, a vertically-structured semiconductor light emitting device 500 includes a heat-sink support 510, in which two thick metal films 514a, 514b on the upper part and the bottom part of a metal foil 512 are bonded by bonding layers 516, 518. The thick metal film 514a is formed at the side of a sapphire substrate where a multi-layered light-emitting structure thin film including Group III-V nitride-based semiconductors is stacked/grown, and the thick metal film 514b corresponds to the thick metal film 430 formed at the side of the supporting substrate 400 of the present invention illustrated in FIG. 4.

As shown in FIG. 5, the vertically-structured semiconductor light emitting device includes conductive multilayers 520, 530, a second ohmic contact electrode 540, an insulating thin film 550, a multi-layered light-emitting structure thin film including Group III-V nitride-based semiconductors 560, a first ohmic contact electrode 570 and a side passivation thin film 580 on the upper part of the heat-sink support 510.

The side passivation thin film 580 is structurally connected to the insulating thin film 550 and protects the side part and a part of the upper surface of the multi-layered light-emitting structure thin film 560.

The heat-sink support 510 is formed by introducing the bonding layers 516, 518 between the metal foil 512 and the thick metal film 514a, 514b through wafer bonding process 516a-516b, 518a-518b.

The metal foil 512, which is a part of the heat-sink support 510, not only supports the multi-layered light-emitting structure thin film 560 to be structurally stable but also is a medium to apply a current and at the same time releases heat generated during the operation of the vertically-structured light-emitting device. Regarding such functions, the metal foil 512 can be formed with one chosen from rolling processed metal, alloy or solid solution having electric and thermal conductivity and a thickness of 0.1-999 μm, preferably including at least one component chosen from Cu, Al, Ni, Nb, W, Mo, Ta, Ti, Au, Ag, Pd, Pt, Cr, Fe, V, Si and Ge.

In addition, the thick metal films 514a, 514b, which are also a part of the metal foil 512, support the multi-layered light-emitting structure thin film 560, function as a medium to apply a current, and release heat. The thick metal film 514a, 514b, as described above, attenuate stress derived from thermal and structural deformation while manufacturing a light emitting device using the supporting substrate 400 through the wafer bonding process. The thick metal film 514a, 514b can have a thickness of 0.1-999 μm.

The bonding layers 516, 518 positioned between the metal foil 512 and thick metal film 514a and 514b can be composed with a soldering or brazing alloy material including at least one component chosen from Ga, Bi, In, Sn, Pb, Au, Al, Ag, Cu, Ni, Pd, Si, and Ge.

Before laminating each of the bonding layers 516, 518 on the upper part and on the bottom part of the metal foil 512, an adhesion-enhancing layer to strengthen bonding between materials and a diffusion barrier layer to prevent diffusion of materials can be additionally formed even though it is not shown.

The reflective second ohmic contact electrode 540, which directly contacts with the multi-layered light-emitting structure thin film 560 including Group III-V nitride-based semiconductors, is composed of a material including at least one chosen from Ag, Al, Rh, Pt, Au, Cu, Ni, Pd, metallic silicides, Ag series alloys, Al series alloys, Rh series alloys, CNTNs (carbon nanotube networks), transparent conducting oxides, and transparent conducting nitrides, so as to reflect photons generated from the multi-layered light-emitting structure thin film 560 in the upward direction.

The insulating thin film 550 facilitates the isolation process to form single chips and is composed of a transparent oxide, a transparent nitride, or a transparent fluoride such as $SiO_2$, SiNx, AlN, ITO, $Al_2O_3$, MgF, $SnO_2$, $ZnO_2$ and the like. It is preferable that the insulating thin film 550 has an omnidirectional reflector (ODR) and a distributed bragg reflector (DBR) structure.

The second conductive thin film 520, including the first conductive thin film 530 formed on the second ohmic contact electrode 540, the adhesion-enhancing layer to strengthen bonding between materials, the diffusion barrier layer to prevent diffusion of materials, or a seeding layer when a conductive thick film is formed by electro plating process, is composed of a material including at least one chosen from Au, Al, Ag, Rh, Ru, Ir, Ti, V, Pd, W, Cr, Ni, Cu, Mo, Ta, Nb, Pt, NiCr, TiW, CuW, TiN, CrN, and TiWN.

The side passivation thin film 580 protecting the side of the multi-layered light-emitting structure thin film 560 is structurally contacted and connected with the insulating thin film 550 and is formed with at least one chosen from $Si_3N_4$, $SiO_2$ and insulating materials.

The first ohmic contact electrode 570 formed on the upper part of the multi-layered light-emitting structure thin film 560 can be formed with a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metal and alloy, metallic silicides, semiconducting silicides, CNTNs, transparent conducting oxides, and transparent conducting nitrides, so as to form ohmic contact to have a low contact resistivity. Particularly, it is preferable that surface treatment such as annealing, oxidation, nitridation and the like is performed to form ohmic contact to have a low contact resistivity.

The multi-layered light-emitting structure thin film 560 has a light emitting device structure to generate photons when current is applied through the first ohmic contact electrode 570 and the second ohmic contact electrode 540 and includes an n-type semiconductor cladding layer, a light-emitting active layer, and a p-type semiconductor cladding layer of which each layer is formed of a single crystal having a composition of $In_x(Ga_yAl_{1-y})N$ ($0 \le x \le 1$, $0 \le y \le 1$, $x+y>0$). Referring to FIG. 5, when the first ohmic contact electrode 570 is an n-type ohmic contact electrode and the second ohmic contact electrode 540 is a p-type ohmic contact electrode, it is preferable that the n-type semiconductor cladding layer is positioned on the bottom part of the first ohmic contact electrode 570 and the p-type semiconductor cladding layer is positioned on the upper part of the second ohmic contact electrode 540.

It is also preferable that a light-extraction structured layer through surface texturing or patterning process, or aluminum film nano-grid polarizer is formed on the surface of the multi-layered light-emitting structure thin film 560, with which the first ohmic contact electrode 570 or the second ohmic contact electrode 540 is contacted, to release the most of photons generated inside the light emitting device outward.

Figure 6:
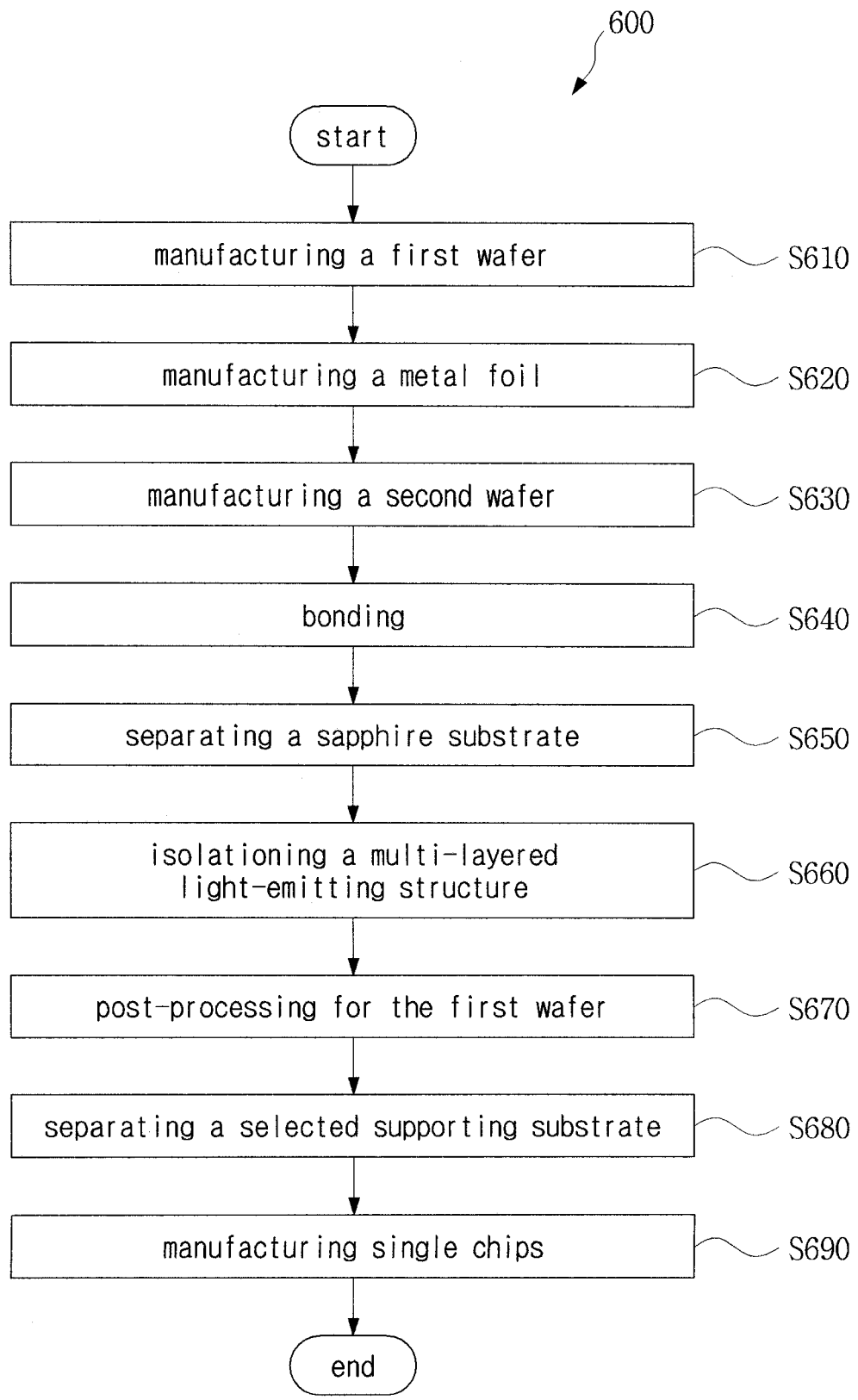
FIG. 6 is a flow diagram illustrating a method for preparing a vertically-structured semiconductor light emitting device using a supporting substrate according to the invention.

Method for Manufacturing a Vertically-structured Semiconductor Light Emitting Device using the Supporting Substrate FIG. 6 is a flow chart illustrating a method for manufacturing a vertically-structured semiconductor light emitting device according to the invention. FIG. 7 to FIG. 17 are sectional views illustrating each respective step shown in FIG. 6. FIG. 6 will be described with reference to FIG. 7 to FIG. 17.

Referring to FIG. 6, the method for manufacturing a vertically-structured semiconductor light emitting device 600 includes preparing a first wafer (S610), preparing a metal foil (S620), preparing a second wafer (S630), bonding (S640), separating a sapphire substrate (S650), isolating a multi-layered light-emitting structure (S660), post-processing for the first wafer (S670), separating a selected supporting substrate (S680) and manufacturing single chips (S690).

Figure 10:
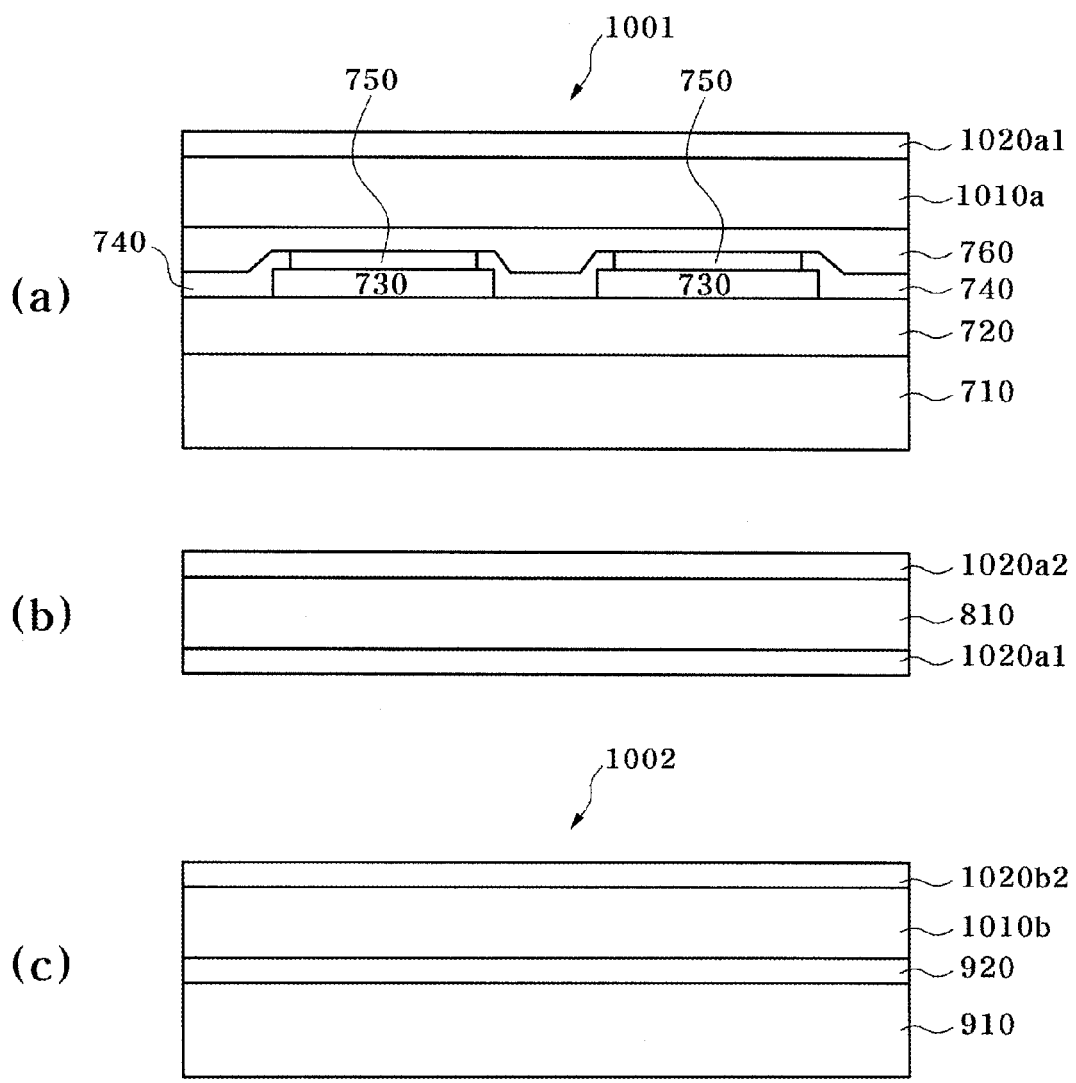

In the step of preparing a first wafer (S610), a multi-layered light-emitting structure thin film including Group III-V nitride-based semiconductors and other ohmic contact electrodes, etc. are formed on the upper part of a sapphire substrate and then a first wafer 1001, formed with a first thick metal film 1010$a$ and a first-first bonding layer 1020$a$1, is formed thereon ((a) of FIG. 10).

Figure 7:
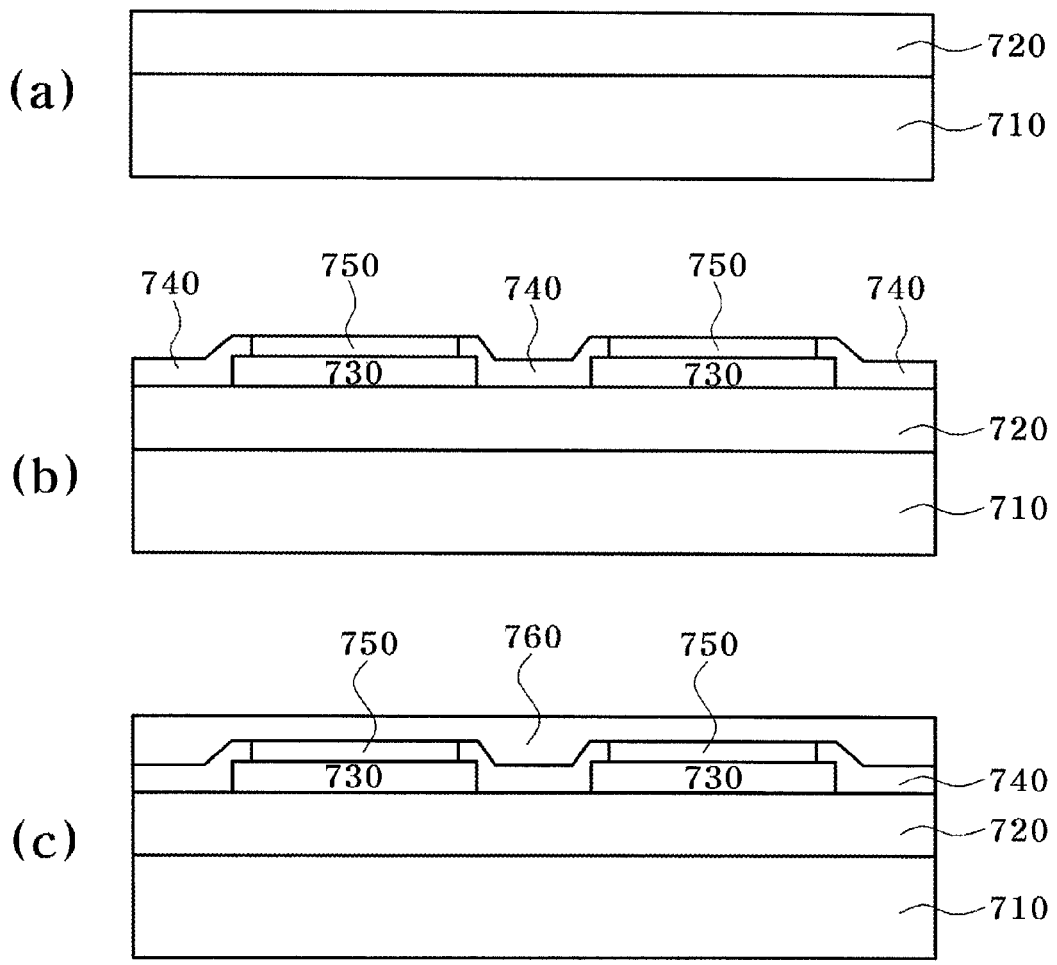
FIG. 7 to FIG. 17 are sectional views illustrating each respective step of the method for preparing a vertically-structured semiconductor light emitting device illustrated in FIG. 6.

FIG. 7 illustrates the step of preparing the first wafer 1001. Referring to FIG. 7, after a multi-layered light-emitting structure thin film 720 is laminated on the upper part of a sapphire substrate 710 ((a) of FIG. 7), a second ohmic contact electrode 730, an insulating thin film 740 and a first conductive thin film 750 are successively laminated ((b) of FIG. 7), and a second conductive thin film 760 is then laminated ((c) of FIG. 7).

The multi-layered light-emitting structure thin film 720 is formed by successively laminating/growing basic layers, which are a low and high temperature buffering layer, an n-type semiconductor cladding layer, a light-emitting active layer, and a p-type semiconductor cladding layer, on the sapphire substrate 710 by employing MOCVD and MBE growth systems, which are the most general growth equipment of Group III-V nitride-based semiconductor thin films.

For example, the Group III-V nitride-based semiconductor thin film 720 can be laminated on the upper part of the transparent sapphire substrate 710 using MOCVD (metal organic chemical vapor deposition), liquid phase epitaxy, hydride vapor phase epitaxy, molecular beam epitaxy, or MOVPE (metal organic vapor phase epitaxy) equipment. The multi-layered light-emitting structure of the light-emitting device is formed by directly laminating/growing a low-temperature buffering layer at the temperature of 600° C. or less on the upper part of the sapphire substrate and further successively laminating/growing a high-temperature buffering layer, a Si-doped n-type semiconductor cladding layer, a semiconductor light-emitting active layer, and Mg-doped p-type semiconductor cladding layer.

Each of the low and high temperature buffering layer, the n-type semiconductor cladding layer, the semiconductor light-emitting active layer, the p-type semiconductor cladding layer of the Group III-V nitride-based semiconductor thin film has the composition of $In_x(Ga_yAl_{1-y})N$ ($1 \le x \le 0$, $1 \le y \le 0$, $x+y>0$). The light-emitting active layer can be a single quantum well (SQW) structure or a multi quantum well (MQW) structure composed of a barrier layer of $In_x(Ga_yAl_{1-y})N$ and a well layer of $In_x(Ga_yAl_{1-y})N$, respectively. A light-emitting device having wide band gaps between a long wavelength of InN (~0.7 eV) band gap and a short wavelength of AlN (~6.2 eV) band gap can be manufactured by controlling the composition ratio of In, Ga, Al of the light-emitting active layer. The band gap of the well layer can be lower than that of the barrier layer to provide electron and hole carriers to the well to improve the internal quantum efficiency. In particular, at least one of the well layer and barrier layer can be Si-doped or Mg-doped to improve the light-emitting characteristics and lower the forward direction operation voltage.

After separating the sapphire substrate, a first ohmic contact electrode, which is an n-type ohmic contact electrode (1410 in FIG. 14), is formed on the surface of the n-type semiconductor cladding layer, and the second ohmic contact electrode 730 and the insulating thin film 740, which are p-type ohmic contact electrodes, are formed on the surface of the p-type semiconductor cladding layer. Before forming the second ohmic contact electrode 730 and the insulating thin film 740 on the upper part of the p-type semiconductor cladding layer, which is the most upper part of the multi-layered light-emitting structure thin film 720, a light-extraction structured layer or an aluminum film nano-grid polarizer can be further formed through surface texturing or patterning process.

The first conductive thin film 750 is formed on a part of the upper part of the second ohmic contact electrode 730 as shown in FIG. 7(b). The second conductive thin film 760, including an adhesion-enhancing layer to strengthen bonding between materials, a diffusion barrier layer to prevent diffusion of materials, or a seeding layer when a conductive thick film is formed by electro plating process, is formed on the upper part of the insulating thin film 740 and the first conductive thin film 750 ((c) of FIG. 7).

Trenches can be formed up to the light-emitting active layer of the multi-layered light-emitting structure thin film 720 or deeper to facilitate the forming of a single chip by using patterning regularly arranged in a plurality of rectangles or squares and a dry etching process, if necessary, even though it is not shown in FIG. 7.

The reflective second ohmic contact electrode 730 formed on the upper part of the multi-layered light-emitting structure thin film 720 is formed with a material including at least one chosen from Ag, Al, Rh, Pt, Au, Cu, Ni, Pd, metallic silicides, Ag series alloys, Al series alloys, Rh series alloys, CNTNs, transparent conducting oxides, and transparent conducting nitrides. The insulating thin film 740 can be formed of transparent oxides, transparent nitrides or transparent fluorides such as $SiO_2$, SiNx, AlN, ITO, $Al_2O_3$, MgF, $SnO_2$, $ZnO_2$ etc. It is preferable that the insulating thin film 740 is an ODR structure and DBR structure.

The first conductive thin film 750 and the second conductive thin film 760 can be formed of a material including at least one chosen from Au, Al, Ag, Rh, Ru, Ir, Ti, V, Pd, W, Cr, Ni, Cu, Mo, Ta, Nb, Pt, NiCr, TiW, CuW, TiN, CrN, and TiWN.

The step of preparing a first wafer (S610) can be performed by the following procedure.

A plurality of second ohmic contact electrodes are formed on the multi-layered light-emitting structure thin film 720 formed on the sapphire substrate 710. The insulating thin film 740 is then formed on the multi-layered light-emitting structure thin film 720 and a plurality of second ohmic contact electrode 730. A plurality of first conductive thin films 750 are then further formed on the plurality of second ohmic contact electrodes 730 by employing partial etching and deposition of the insulating thin film 740. The second conductive thin film 760, including an adhesion-enhancing layer to strengthen bonding between materials and a diffusion barrier layer to prevent diffusion of materials or a seeding layer when a thick metal film 1010a is formed by an electro plating process, is formed on the insulating thin film 740 and the plurality of second ohmic contact electrode 730.

In the step of preparing a metal foil (S620), a second-first bonding layer 1020b1 and a first-second bonding layer 1020a2 are formed on the upper surface and the bottom surface of a metal foil 810, respectively ((b) of FIG. 10).

Figure 8:
Figure 9:
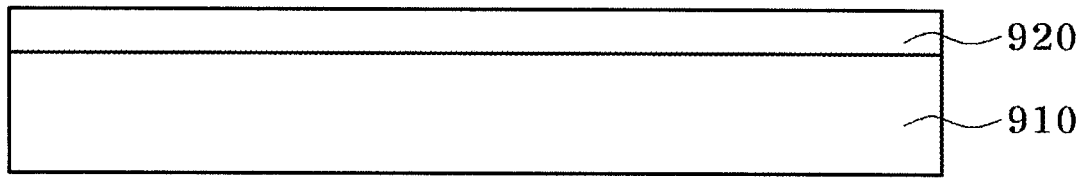

FIG. 8 is a sectional view illustrating the metal foil 810 including the heat-sink support (510 in FIG. 5). The metal foil 810 is formed with one chosen from rolling processed metal, alloy or solid solution having electric and thermal conductivity and a thickness of 0.1-999 μm. It is preferable that the metal foil 810 includes at least one component chosen from Cu, Al, Ni, Nb, W, Mo, Ta, Ti, Au, Ag, Pd, Pt, Cr, Fe, V, Si and Ge.

An adhesion-enhancing layer can be formed to improve the bonding effect in the step of bonding (S640) before forming the first-second bonding layer 1020a2 and second-first bonding layer 1020b1 on the upper surface and the bottom surface of the metal foil 810.

Figure 4:
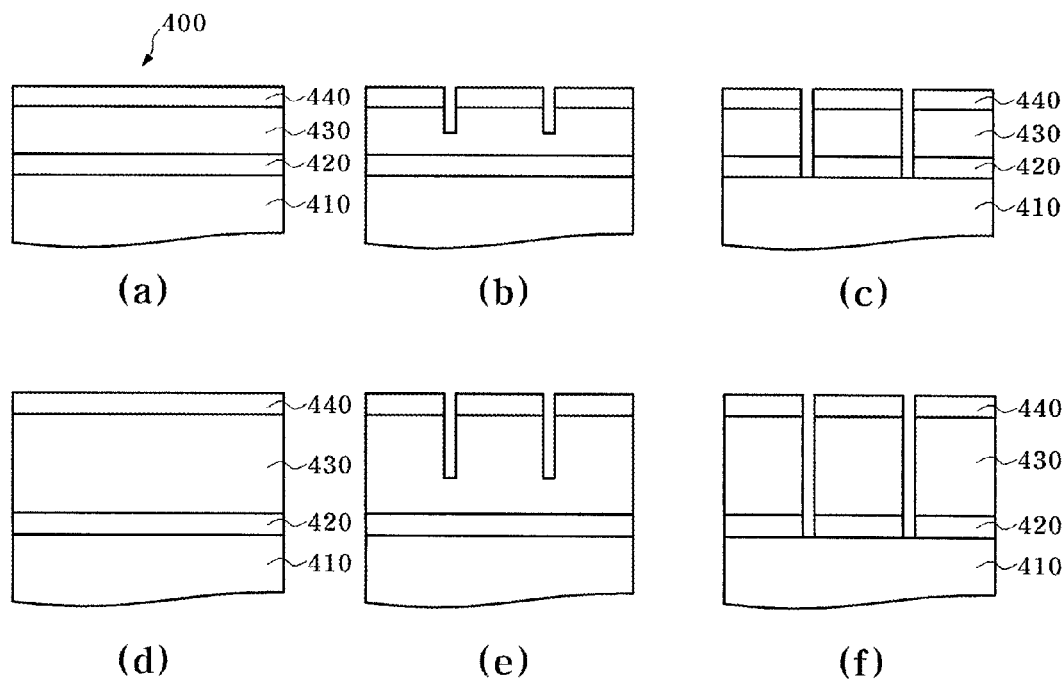
FIG. 4(a) to FIG. 4(f) are stacked sectional views illustrating examples of various modes of supporting substrates for manufacturing a vertically-structured semiconductor light emitting device.

In the step of preparing a second wafer (S630), a second wafer 1002 having the same structure of the supporting substrate 400 shown in FIG. 4 is prepared by successively laminating/growing a sacrificial layer 920, a second thick metal film 1010b and a second-second bonding layer 1020b2 on a selected supporting substrate 910 ((c) of FIG. 10).

The sacrificial layer 920, the thick metal film 1010b and the second-second bonding layer 1020b2 can be successively formed on the selected supporting substrate 910 through physical vapor deposition (PVD), chemical vapor deposition (CVD) or electro plating.

In particular, the sacrificial layer 920 is formed by one method chosen from e-beam evaporation, thermal evaporation, MOCVD, sputtering and PLD (pulsed laser deposition), and the second thick metal film 1010b and the first thick metal film 1010a of the first wafer are formed through electro plating or electroless plating.

In addition, after forming a further diffusion barrier layer or adhesion-enhancing layer on the second thick metal film 1010b, a second-second bonding layer 1020b2 can be formed.

Figure 11:
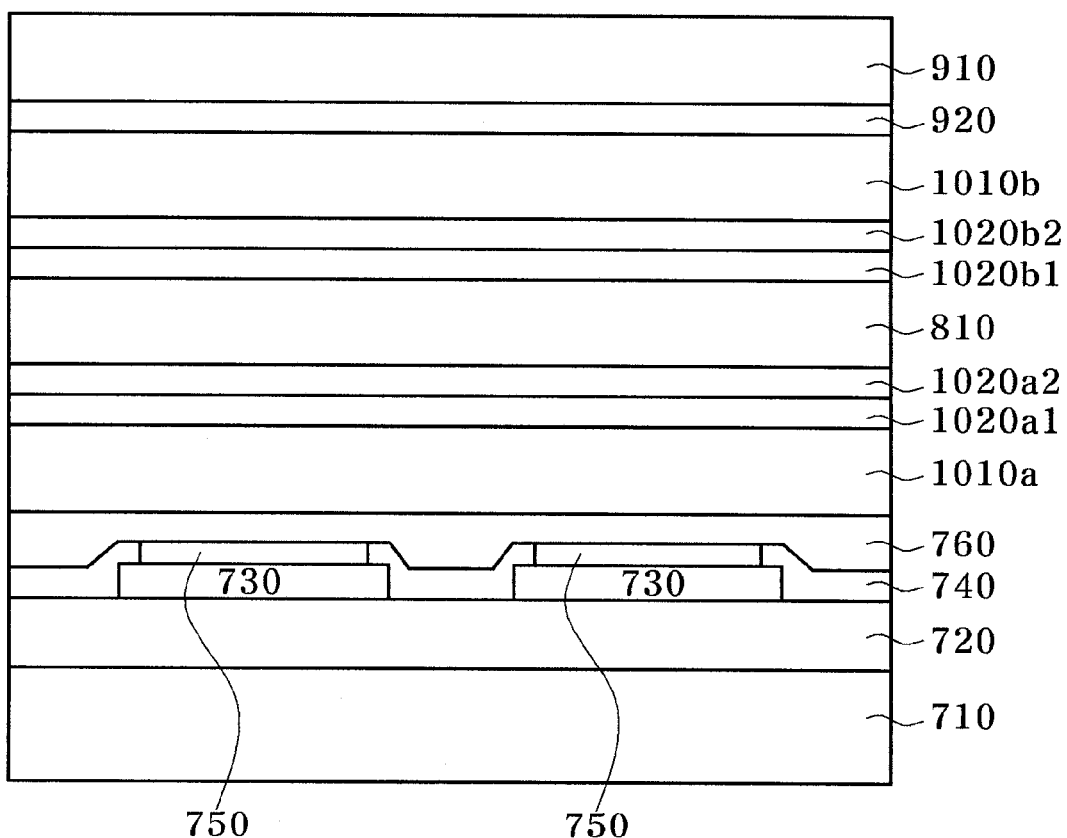

In the step of boning (S640), the first-first bonding layer 1020a1 of the first wafer 1001 and the first-second bonding layer 1020a2 of the metal foil 810, the second-first bonding layer 1020b1 of the metal foil 810 and the second-second bonding layer 1020b2 of the second wafer 1002 are bonded as wafer to wafer bonding (FIG. 11). For this bonding, it is preferable that each bonding layer is formed of a soldering or brazing alloy material including at least one chosen from Ga, Bi, In, Sn, Pb, Au, Al, Ag, Cu, Ni, Pd, Si, and Ge. Further, prior to forming each bonding layer, an adhesion-enhancing layer to strengthen bonding between materials and a diffusion barrier layer to prevent diffusion of materials can be additionally formed.

In the step of boning (S640), the first thick metal film and the second thick metal film 1010a, 1010b attenuate thermal and structural stress and provide other functions. Therefore, the thick metal film can be composed with metal, alloy, or solid solution including at least one component chosen from Au, Cu, Ni, Ag, Mo, Al, Nb, W, Ti, Cr, Ta, Al, Pd, Pt, Si, which have high electrical and thermal conductivities and can be formed by physical vapor deposition (PVD) or chemical vapor deposition (CVD), preferably by electro plating or electroless plating.

The step of boning (S640) can be performed by a thermo compression bonding method under the condition of temperature of 100° C. to 600° C. and pressure of 1 Mpa to 200 Mpa.

After the bonding step, a vertically-structured result from the sapphire substrate 710 of the first wafer 1001 to the selected supporting substrate 910 of the second wafer 1002 is produced as shown in FIG. 11.

Figure 12:
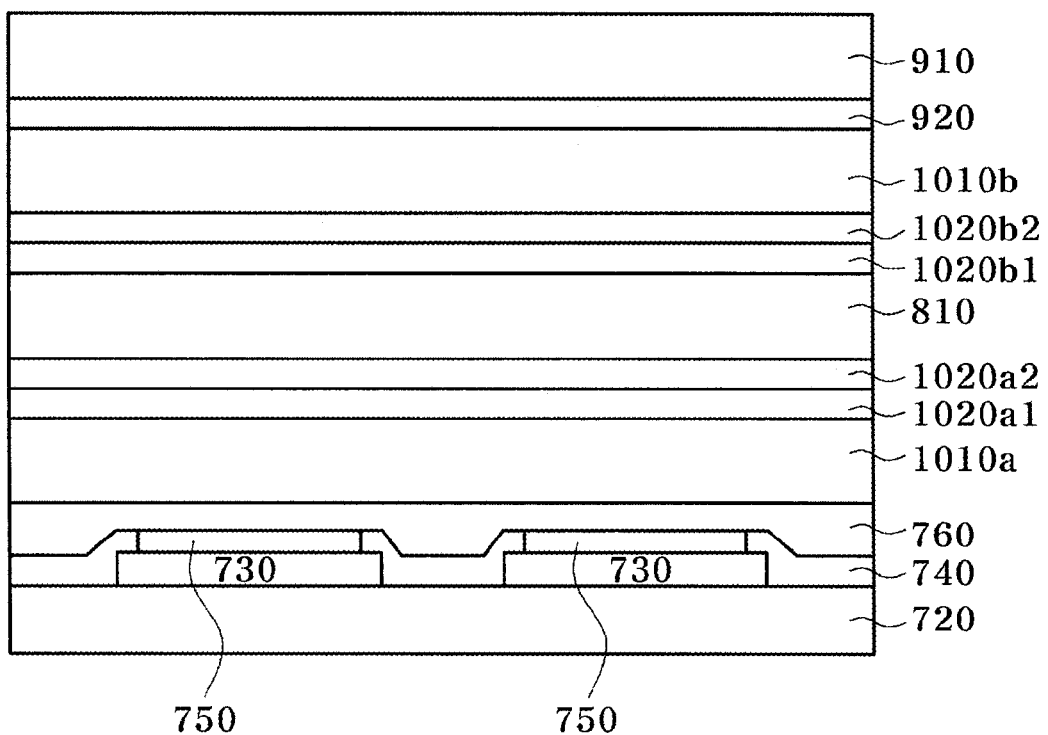

In the step of separating a sapphire substrate (S650), the sapphire substrate 710 of the first wafer is separated from the result bonded in the step of bonding (S640) (see FIG. 12).

The sapphire substrate 710 can be separated by using a general laser lift off process. When a laser beam, which is a strong energy source, is irradiated to the back side of the sapphire substrate, the interface between the multi-layered light-emitting structure thin film 720 including Group III-V nitride-based semiconductor single crystals and the sapphire substrate 710 absorbs the strong laser so that the sapphire substrate 710 is lifted off by thermo-chemical dissociation of gallium nitride (GaN) existing in the interface.

Here, it is preferable that a step is further included to treat the surface of the multi-layered light-emitting structure thin film 720, which is exposed to the air, with at least one chosen from $H_2SO_4$, HCl, KOH, and BOE at the temperature of 30° C. to 200° C. It is also preferred that the sapphire substrate 710 is completely removed through the mechanical-chemical polishing and sequential wet etching process. The wet etching process of the sapphire substrate can be performed in an etching solution chosen from sulfuric acid ($H_2SO_4$), chromic acid ($CrO_3$), phosphoric acid ($H_3PO_4$), gallium (Ga), magnesium (Mg), indium (In), aluminum (Al) and a mixture thereof. A temperature of the wet etching solution can be 200° C. or higher After completing the separation of the sapphire substrate 710, as shown in FIG. 12, a result is formed from the multi-layered light-emitting structure thin film 720 of the first wafer 1001 to the selected supporting substrate 910 of the second wafer 1002.

Figure 13:
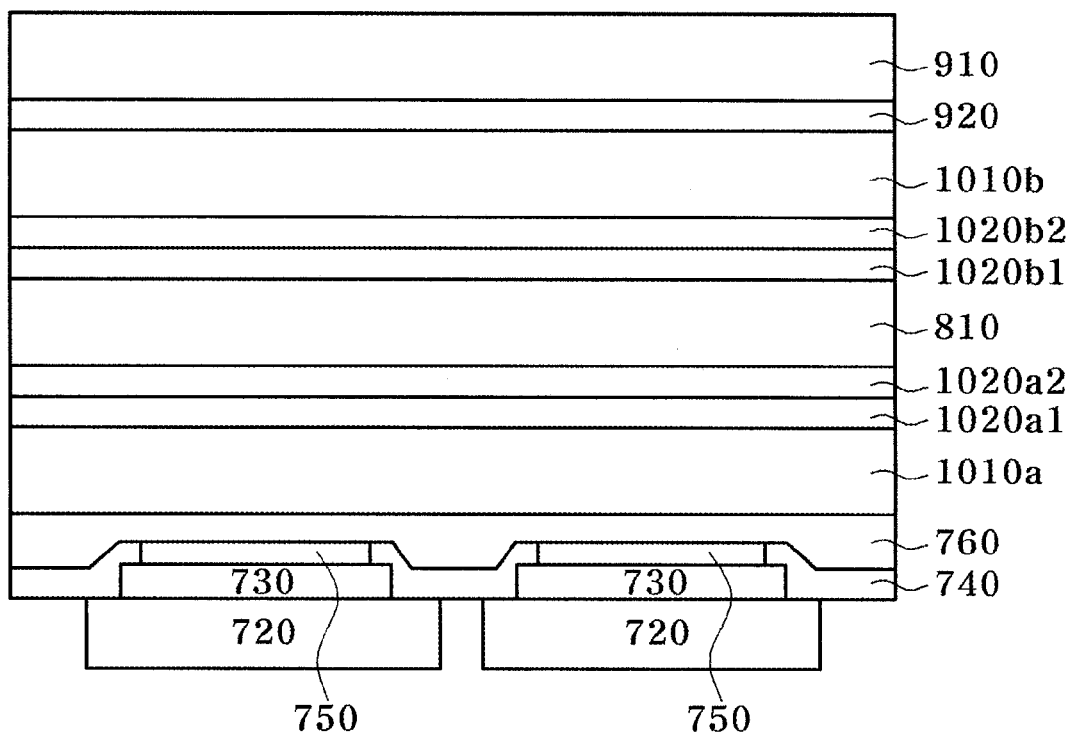

In the step of isolating a multi-layered light-emitting structure (S660), isolation of the multi-layered light-emitting structure thin film 720, of which the surface is exposed by being separated from the sapphire substrate 710, is conducted to provide a plurality of light emitting devices (see FIG. 13).

FIG. 13 is a sectional view of the multi-layered light-emitting structure thin film 720 after conducting the isolation of the multi-layered light-emitting structure thin film 720, which is separated from the sapphire substrate and exposed to the air, into a single chip dimension and shape.

Referring to FIG. 13, the multi-layered light-emitting structure thin film 720 is conducted for isolation process using wet or dry etching process till the insulating thin film 740 is exposed to the air.

In the step of post-processing of the first wafer (S670), a first ohmic contact electrode 1410 is formed on each isolated multi-layered light-emitting structure thin film 720, and a passivation thin film 1420 is formed at the side of the multi-layered light-emitting structure thin film 720.

Figure 14:
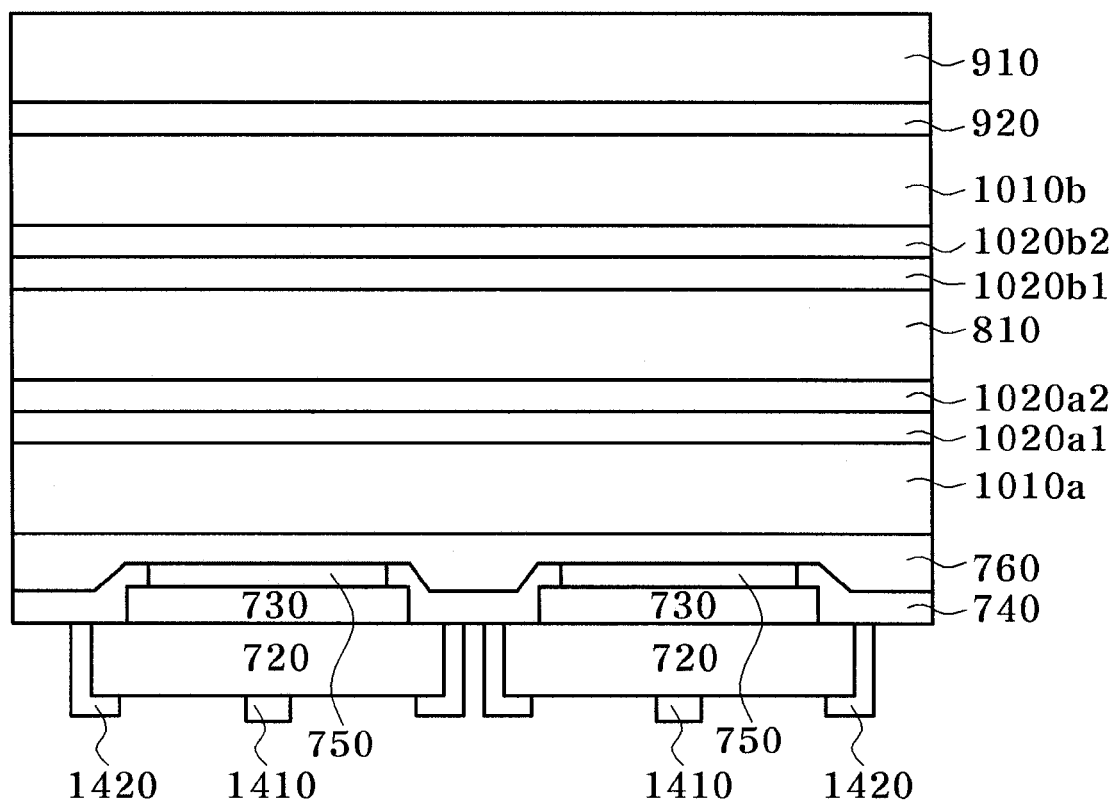

FIG. 14 is a sectional view of the result formed with the side passivation thin film 1420 and the first ohmic contact electrode 1410.

Referring to FIG. 14, the step of post-processing can include cleaning, forming the thin side passivation film 1420 and the first ohmic contact electrode 1410, and annealing, etc.

In the step of post-processing of the first wafer (S670), a first ohmic contact electrode, which is thermally stable, is formed on the upper part of a buffering layer or an n-type semiconductor cladding layer, which is the multi-layered light-emitting structure thin film 720, through the first ohmic contact electrode material deposition and annealing process. It is preferable that passivation thin film 1420 is formed on the surface or sides of the Group III nitride-based semiconductor device by using at least one chosen from $Si_3N_4$, $SiO_2$, or electric insulating materials.

In addition, the first ohmic contact electrode 1410 can be formed of a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs, transparent conducting oxides, and transparent conducting nitrides.

In the step of separating a selected supporting substrate (S680), the selected supporting substrate 910 is separated from the second wafer 1002 using laser lift off process of chemical etching process.

Figure 15:
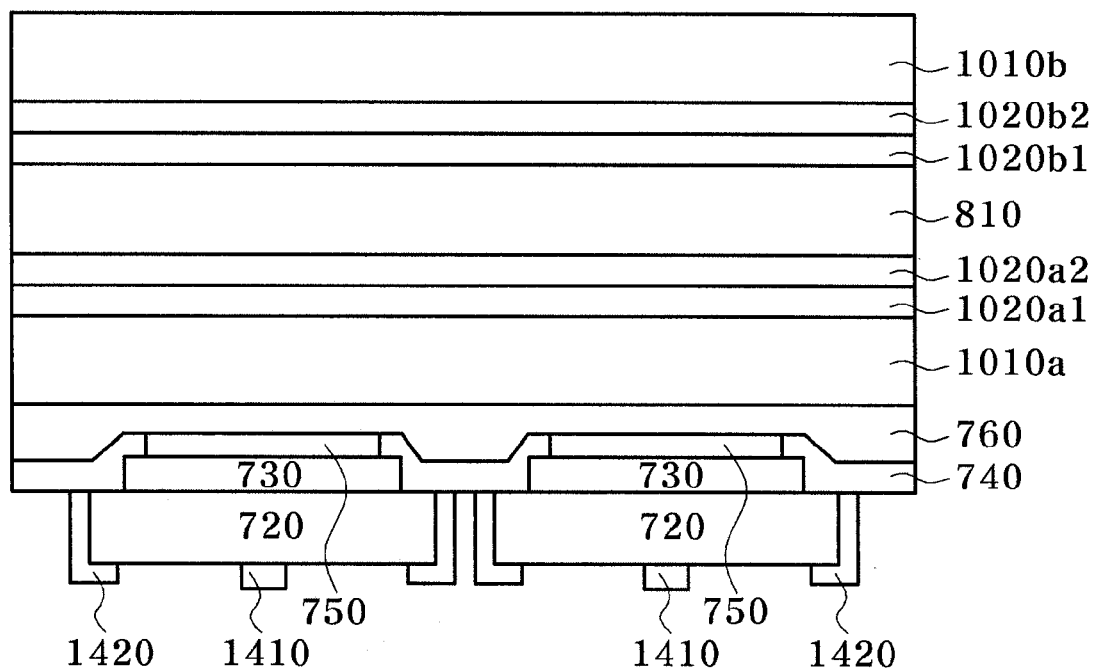

FIG. 15 is a sectional view illustrating the result after the selected supporting substrate 910 is separated from the second wafer 1002.

When the selected supporting substrate 910 is optically transparent, the selected supporting substrate 910 is separated by irradiating a laser beam having an appropriate absorption wavelength range according to the material used for the sacrificial layer at the backside of the transparent selected supporting substrate 910 as described above for the separation of the sapphire substrate. When a laser beam is irradiated, the interface between the sacrificial layer 920 and the transparent selected supporting substrate 910 absorbs strong laser so that the selected supporting substrate 910 is lifted off by thermo-chemical dissociation of the material of the sacrificial layer 920 or separation due to mechanical impact. There can be an additional step of treating the residue of the sacrificial layer 920, which is exposed to the air, with any acid, base or salt solution such as $H_2SO_4$, HCl, KOH, and BOE at the temperature of 30° C. to 200° C.

The selected supporting substrate 910 can be completely removed through the mechanical-chemical polishing and subsequent wet etching process in addition to the laser lift off process. The material used for the sacrificial layer 920 can be a single crystal, polycrystal or amorphous compound bonded with nitrogen or oxygen, and examples thereof include GaN, InGaN, ZnO, InN, $In_2O_3$, ITO, $SnO_2$, $In_2O_3$, $Si_3N_4$, $SiO_2$, BeMgO, MgZnO, TiN, VN, CrN, TaN and the like.

Further, the sacrificial layer 920 can be at least one material selected from the group consisting of metals, alloys, solid solutions, oxides, nitrides and thermophile organic materials to be separated from the selected supporting substrate 910 by chemical etching. In this case, the selected supporting substrate 910 is completely removed, and thus it is not necessary to conduct any additional laser lift off process.

When the thickness of a heat-sink support (1710 in FIG. 17) formed with the metal foil 810 and the thick metal films 1010a, 1010b is thick enough to be structurally stable, the step of manufacturing a single chip can be performed with any additional support bonding process. However, it is preferable that when the heat-sink support 1710 is not thick enough to be structurally stable, an additional bonding layer composed of metal, alloy or conductive adhesive is formed as a supplementary support and bonded to the heat-sink support 1710 to have a sufficient thickness, and the step for manufacturing a single chip can be then performed.

Here, the supplementary support can be formed of a single crystal or polycrystal wafer such as Si, Ge, SiGe, ZnO, GaN, AlGaN, GaAs, AlN, BeO etc, or a metal foil such as Mo, Cu, Ni, Nb, Ta, Ti, Au, Ag, Cr, NiCr, CuW, CuMo, NiW, etc. or laminates such as Cu/Mo/Cu, Cu/W/Cu, Ni/Mo/Ni, Cu/Ti/Cu, Cu/AlN/Cu, Cu/Al2O3/Cu, Cu/GaAs/Cu, Cu/Si/Cu, etc. which have good thermal and electric conductivity.

In addition, the step of separating the selected supporting substrate (S680) can be performed after bonding a temporary supporting substrate with an organic or inorganic bonding material on the surface of the first wafer 1001.

In the step of manufacturing a single chip (S690), single chips are formed by vertically cutting the result produced from the bonding step (S640) to the separation step of the selected supporting substrate (S680).

Figure 16:
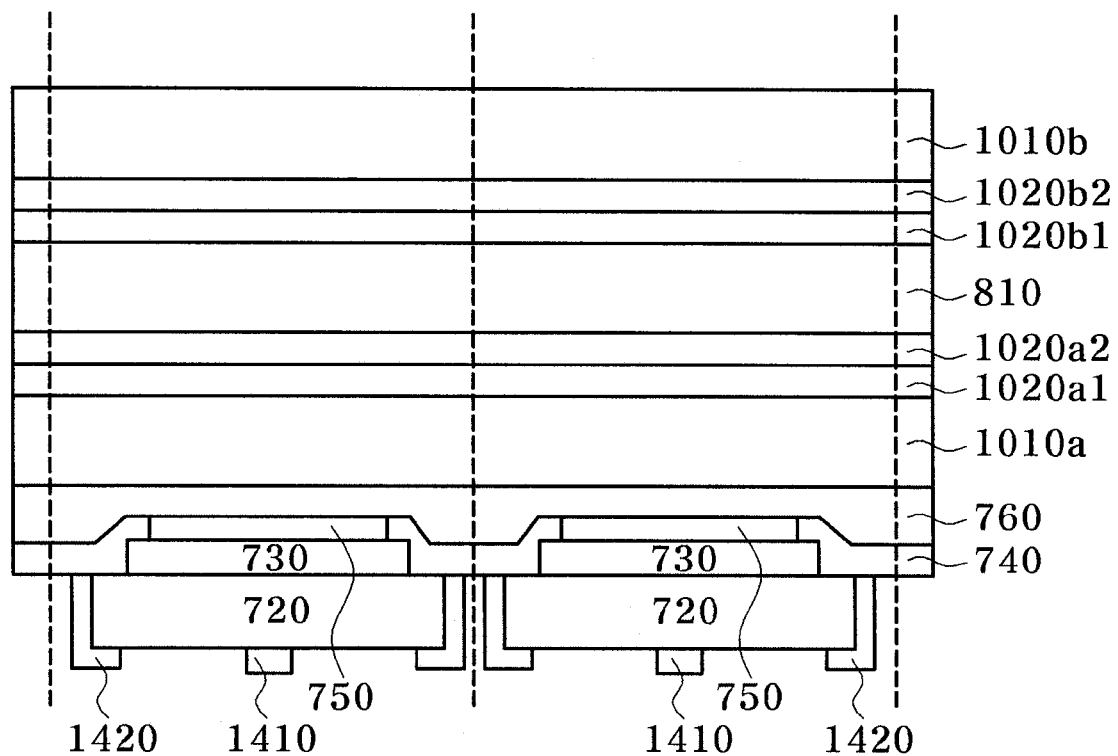

FIG. 16 is a sectional view illustrating a process of manufacturing single chips.

Referring to FIG. 16, the single chip is formed by cutting between the side passivation thin film 1420 isolated in the chip shape using a mechanical cutting process such as a laser scribing or sawing. Here, there can be micro-cracks inside the single chip caused by mechanical impact and thermal dissociation due to a great amount of heat generated from laser cutting and sawing process. However, in the semiconductor light emitting device of the present invention, the metal foil 810 or the first, second thick metal films 1010a, 1010b can absorb mechanical impact and release heat so that such problems can be attenuated.

Figure 17:
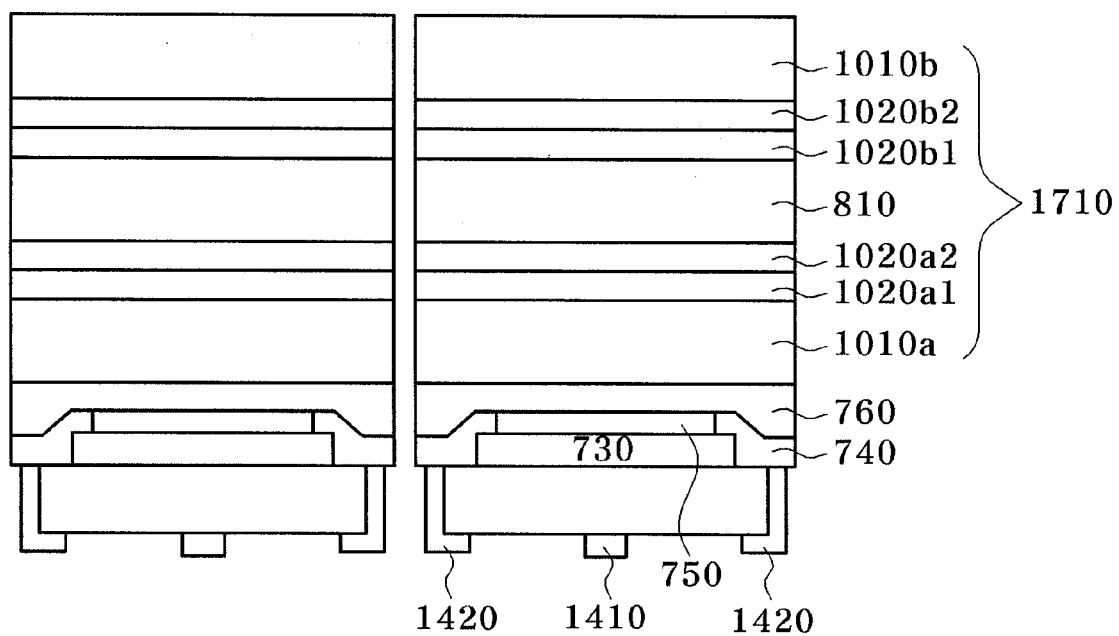

FIG. 17 is a sectional view illustrating a vertically-structured semiconductor light emitting device in a single chip form.

Referring to FIG. 17, the finally completed semiconductor light emitting device has a vertical structure of which the heat-sink support 1710 including two thick metal films 1010a, 1010b and the metal foil 810 is formed structurally stably on the top.

Vertically-structured Semiconductor Light Emitting Device II

Even though FIG. 5 and FIG. 17 illustrate the heat-sink support 510, 1710 including two thick metal films and the metal foil, only one of the two thick metal films can be formed. Examples of semiconductor light emitting devices having such structure are illustrated in FIG. 18 and FIG. 19.

Figure 18:
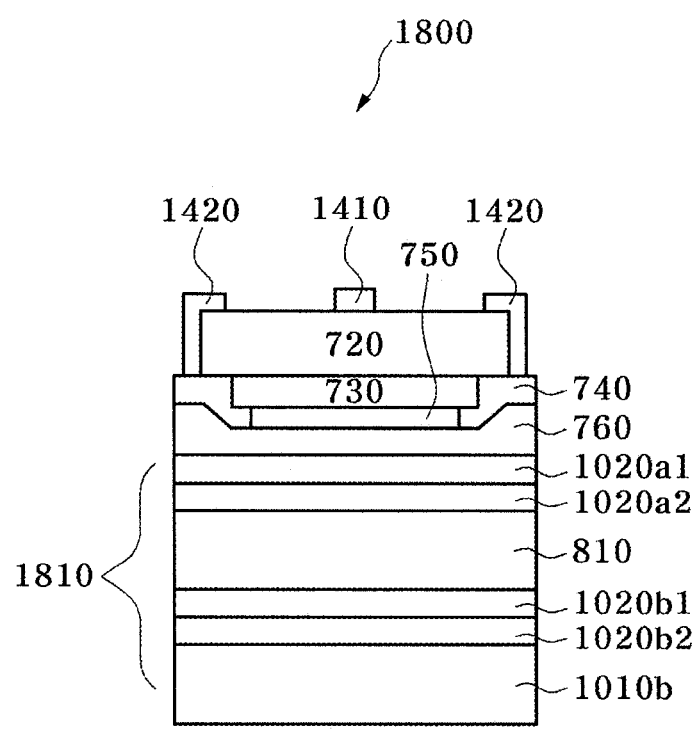
FIG. 18 and FIG. 19 illustrate examples of a vertically-structured semiconductor light emitting device including a heat-sink support consisted with a metal foil and one thick metal film.
Figure 19:
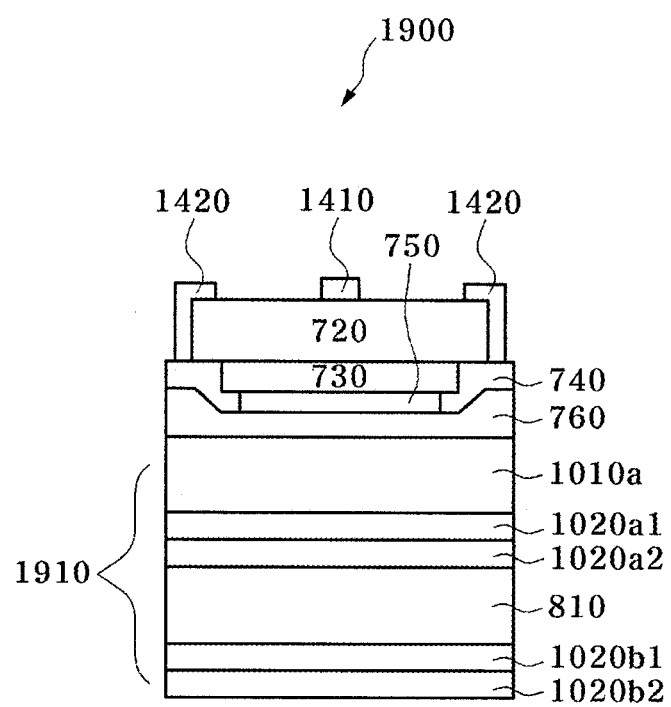

FIG. 18 is a sectional view illustrating another example of a vertically-structured semiconductor light emitting device according to the present invention.

The vertically-structured semiconductor light emitting device 1800 shown in FIG. 18 includes a heat-sink support 1810 in which the second thick metal film 1010b is bonded by the bonding layers 1020b1, 1020b2 to the bottom part of the metal foil 810 without forming the first thick metal film 1010a.

The semiconductor light emitting device 1800 according to an embodiment of the present invention has a vertical structure of the second thick metal film 1010b—the metal foil 810—the multi-layered light-emitting structure thin film 720. The vertically-structured semiconductor light emitting device illustrated in FIG. 18 can be formed by the method illustrated in FIG. 6. However, the first thick metal film 1010a is not formed in the step for preparing a first wafer (S610).

FIG. 19 is a sectional view illustrating another example of a vertically-structured semiconductor light emitting device according to the present invention.

The vertically-structured semiconductor light emitting device 1900 shown in FIG. 19 includes a heat-sink support 1910 in which the first thick metal film 1010a is bonded by the bonding layers 1020a1, 1020a2 to the upper part of the metal foil 810 without forming the second thick metal film 1010b.

The semiconductor light emitting device 1900 according to an embodiment of the present invention has vertical structure of the metal foil 810—the first thick metal film 1010a—the multi-layered light-emitting structure thin film 720.

The vertically-structured semiconductor light emitting device illustrated in FIG. 19 can be formed by the method illustrated in FIG. 6. However, the second thick metal film 1010b is not formed in the step for preparing a second wafer (S620), or when the selected supporting substrate 910 is separated, it is removed up to the second thick metal film 1010a after wafer to wafer bonding.

The second thick metal film 1010a can be removed by using the patterned supporting substrate shown in FIG. 4 through a physical or chemical etching process.

The supporting substrate, the vertically-structured semiconductor light emitting device and its manufacturing method according to the present invention can be easily applied to other fields. In particular, they can be also suitable for various optoelectronic devices including vertically-structured laser diode, transistor, etc. using a homo-epitaxial Group III-V nitride-based semiconductor substrate and a multi-layered light-emitting structure thin film including Group III-V nitride-based semiconductors, which are formed by growing a Group III-V nitride-based semiconductor on the upper part of a sapphire substrate.

While particular embodiments have been described, it is to be appreciated that various changes and modifications can be made by those skilled in the art without departing from the scope of the embodiment herein, as defined by the appended claims and their equivalents. Therefore, the true scope of protection will be defined by the claims.

[Industrial Applicability]

When a vertically-structured semiconductor light emitting device is manufactured by using a supporting substrate according to the present invention, it can improve not only the production yield of LEDs of multi-layered light-emitting structure thin film including Group III-V nitride-based semiconductors but also the heat dissipation and prevention of static electricity by separating the sapphire substrate.

Further, when a vertically-structured semiconductor light emitting device is manufactured by using a supporting substrate according to the present invention, it can eliminate wafer warpage during the wafer bonding, minimize microcrack or breaking by reducing stress in the multi-layered light-emitting structure thin film during the laser lift off process to separate the sapphire substrate, etc., and minimize the separation of the multi-layered light-emitting structure thin film into wafer bonding materials.

In addition, when a vertically-structured semiconductor light emitting device is manufactured by using a supporting substrate according to the present invention, it can be possible to provide a highly reliable light-emitting device that causes no thermal or mechanical damage since any post-processing such as annealing, side passivation, etc. can be freely performed.

In addition, when a vertically-structured semiconductor light emitting device is manufactured by using a supporting substrate according to the present invention, it can allow a significantly higher production yield in manufacturing chips than in the conventional mechanical and laser processes, since wet etching can be used in the present invention rather.

The supporting substrate according to the present invention allows not only the manufacturing of a high quality nitride-based semiconductor single crystal multi-layered thin film by employing wafer bonding but also any kind of post-processing after separating the sapphire substrate so that it is suitable for manufacturing light emitting devices having high performance heat-sink support including the metal foil or thick metal films.

The invention claimed is:

1. A vertically-structured semiconductor light emitting device comprising:
 a light emitting structure comprising a Group III-V nitride-based semiconductor, a first contact electrode on an upper part of the Group III-V nitride-based semiconductor, a second contact electrode, an insulating thin film, a first conductive thin film, a second conductive thin film and a first thick metal film on a bottom part of the Group III-V nitride-based semiconductor, and a passivation thin film on a side of the Group III-V nitride-based semiconductor;

a metal foil bonded at a bottom part of the first thick metal film by a first bonding layer; and a second thick metal film bonded at a bottom part of the metal foil by a second bonding layer, wherein a thickness of the metal foil is equal to or greater than a thickness of the first thick metal film and a thickness of the second thick metal film.

2. A vertically-structured semiconductor light emitting device comprising:

a light emitting structure comprising a Group III-V nitride-based semiconductor, and a first contact electrode on an upper part of the Group III-V nitride-based semiconductor, and a second contact electrode, an insulating thin film, a first conductive thin film, and a second conductive thin film on a bottom part of the Group III-V nitride-based semiconductor, and a passivation thin film on a side of the Group III-V nitride-based semiconductor;

a metal foil bonded at a bottom part of the second conductive thin film by a first bonding layer; and a thick metal film bonded at a bottom part of the metal foil by a second bonding layer, wherein a thickness of the metal foil is equal to or greater than a thickness of the thick metal film.

3. A vertically-structured semiconductor light emitting device comprising:

a light emitting structure comprising a Group III-V nitride-based semiconductor and a first contact electrode on an upper part of the Group III-V nitride-based semiconductor, and a second contact electrode, an insulating thin film, a first conductive thin film, a second conductive thin film and a first thick metal film on a bottom part of the Group III-V nitride-based semiconductor, and a passivation thin film on a side of the Group III-V nitride-based semiconductor; and a metal foil bonded at a bottom of the first thick metal film by a first bonding layer, wherein a thickness of the metal foil is equal to or greater than a thickness of the first thick metal film.

4. The vertically-structured semiconductor light emitting device of claim 1, wherein the light-emitting structure comprises an n-type semiconductor cladding layer, a light-emitting active layer and a p-type semiconductor cladding layer from the top thereof, and each layer of the light-emitting structure is composed of a single crystal having the composition of $In_x(Ga_yAl_{1-y})N$ ($0 \le x \le 1$, $0 \le y \le 1$, $x+y>0$).

5. The vertically-structured semiconductor light emitting device of claim 1, wherein at least one of surface texture, light-extraction structured layer, and aluminum film nano-grid polarizer is further formed on an upper part or a bottom part of the light-emitting structure.

6. The vertically-structured semiconductor light emitting device of claim 1, wherein the metal foil has a thickness of 0.1-999 μm.

7. The vertically-structured semiconductor light emitting device of claim 1, wherein the metal foil is metal, alloy or solid solution in a plate form comprising at least one component selected from the group consisting of Cu, Al, Ni, Nb, W, Mo, Ta, Ti, Au, Ag, Pd, Pt, Cr, Fe, V, Si and Ge.

8. The vertically-structured semiconductor light emitting device of claim 1, wherein the first thick metal film is formed of metal, alloy or solid solution comprising at least one component selected from the group consisting of Au, Cu, Ni, Ag, Mo, Al, Nb, W, Ti, Cr, Ta, Al, Pd, Pt, and Si.

9. The vertically-structured semiconductor light emitting device of claim 1, wherein the first thick metal film has a thickness of 0.1-999 μm.

10. The vertically-structured semiconductor light emitting device of claim 1, wherein the second thick metal film is formed of metal, alloy or solid solution comprising at least one component selected from the group consisting of Au, Cu, Ni, Ag, Mo, Al, Nb, W, Ti, Cr, Ta, Al, Pd, Pt and Si.

11. The vertically-structured semiconductor light emitting device of claim 1, wherein the second thick metal film has a thickness of 0.1-999 μm.

12. The vertically-structured semiconductor light emitting device of claim 1, wherein the first bonding layer is formed of soldering or brazing alloy comprising at least one component selected from the group consisting of Ga, Bi, In, Sn, Pb, Au, Al, Ag, Cu, Ni, Pd, Si, Ge and Zn.

13. The vertically-structured semiconductor light emitting device of claim 1, wherein the second bonding layer is formed of soldering or brazing alloy comprising at least one component selected from the group consisting of Ga, Bi, In, Sn, Pb, Au, Al, Ag, Cu, Ni, Pd, Si, Ge and Zn.

14. The vertically-structured semiconductor light emitting device of claim 1, wherein the first contact electrode is formed of a material comprising at least one component selected from the group consisting of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals, metallic silicides, semiconducting silicides, CNTNs, transparent conducting oxides and transparent conducting nitrides.

15. The vertically-structured semiconductor light emitting device of claim 1, wherein the second contact electrode is formed of a material comprising at least one component selected from the group consisting of Ag, Al, Rh, Pt, Au, Cu, Ni, Pd, metallic silicides, Ag series alloy, Al series alloy, Rh series alloy, CNTNs, transparent conducting oxides and transparent conducting nitrides.

16. The vertically-structured semiconductor light emitting device of claim 1, wherein the insulating thin film is formed of any one selected from the group consisting of transparent oxides, transparent nitrides or transparent fluorides.

17. The vertically-structured semiconductor light emitting device of claim 1, wherein the insulating thin film is formed in an omni-directional reflector (ODR) structure or a distributed bragg reflector (DBR) structure.

18. The vertically-structured semiconductor light emitting device of claim 1, wherein the first conductive thin film or the second conductive thin film is formed of a material comprising at least one component selected from the group consisting of Au, Al, Ag, Rh, Ru, Ir, Ti, V, Pd, W, Cr, Ni, Cu, Mo, Ta, Nb, Pt, NiCr, TiW, CuW, TiN, CrN and TiWN.

19. The vertically-structured semiconductor light emitting device of claim 2, wherein the metal foil and the thick metal film have a thickness of micrometer unit respectively.

20. The vertically-structured semiconductor light emitting device of claim 3, wherein the first thick metal film and the metal foil have a thickness of micrometer unit respectively.

21. The vertically-structured semiconductor light emitting device of claim 1, wherein the first thick metal film, the metal foil and the second thick metal film function as a heat-sink support as well as support the light emitting structure.

22. The vertically-structured semiconductor light emitting device of claim 2, wherein the thick metal film and the metal foil function as a heat-sink support as well as support the light emitting structure.

23. The vertically-structured semiconductor light emitting device of claim 3, wherein the first thick metal film and the metal foil function as a heat-sink support as well as support the light emitting structure.

* * * * *